United States Patent
Wang et al.

(10) Patent No.: US 9,684,030 B2
(45) Date of Patent: Jun. 20, 2017

(54) DRUM-TYPE IC BURN-IN AND TEST EQUIPMENT

(71) Applicant: An-Sung Wang, New Taipei (TW)

(72) Inventors: An-Sung Wang, New Taipei (TW); Ching-Chang Wong, New Taipei (TW)

(73) Assignees: An-Sung Wang, New Taipei (TW); Ching-Chang Wong, New Taipei (TW)

(*) Notice: Subject to any disclaimer, the term of this patent is extended or adjusted under 35 U.S.C. 154(b) by 223 days.

(21) Appl. No.: 14/583,213

(22) Filed: Dec. 26, 2014

(65) Prior Publication Data

US 2016/0187418 A1 Jun. 30, 2016

(51) Int. Cl.
| | |
|---|---|
| *G01R 31/02* | (2006.01) |
| *G01R 31/28* | (2006.01) |
| *H05K 3/30* | (2006.01) |
| *H05K 13/04* | (2006.01) |

(52) U.S. Cl.
CPC ..... *G01R 31/2863* (2013.01); *G01R 31/2867* (2013.01); *G01R 31/2868* (2013.01)

(58) Field of Classification Search
CPC .......... G01R 31/02; G01R 31/28; H05K 3/30; H05K 13/04
USPC ................. 324/750.05, 757.02, 555, 762.01; 29/740, 741, 743, 759, 760, 626, 836, 29/838
See application file for complete search history.

(56) References Cited

U.S. PATENT DOCUMENTS

| | | | | |
|---|---|---|---|---|
| 4,202,092 A | * | 5/1980 | Shibasaki | H05K 13/0495 29/741 |
| 4,351,108 A | * | 9/1982 | Johnson | G01R 31/2867 29/741 |
| 5,870,820 A | * | 2/1999 | Arakawa | H05K 13/0486 29/740 |
| 6,384,593 B1 | * | 5/2002 | Kobayashi | G01R 31/2868 324/750.05 |
| 6,999,888 B2 | * | 2/2006 | Repko | G06F 11/2733 702/120 |
| 7,378,836 B2 | * | 5/2008 | Teoh | G01R 31/2867 324/750.05 |
| 2013/0257471 A1 | * | 10/2013 | Lee | G01R 31/2808 324/757.02 |

* cited by examiner

*Primary Examiner* — Arleen M Vazquez
*Assistant Examiner* — Neel Shah
(74) *Attorney, Agent, or Firm* — Leong C. Lei

(57) ABSTRACT

Disclosed is drum-type IC burn-in and test equipment including burn-in equipment. The burn-in equipment includes therein a first working platform, a second working platform, a drum-type burn-in device, and a parts pickup device. The first working platform includes a first parts disposition section and a parts feeding device. The second working platform includes a parts transferring device. The drum-type burn-in device is rotatably mounted between the first and second working platforms and includes multiple planar sections circumferentially mounted thereto with each planar section having at least one burner mounted thereon. This arrangement allows a parts feeding device to sequentially dispose unburned ICs and a parts transferring device to sequentially pick up completely-burned ICs. As such, the drum-type burn-in device helps increase the number of ICs disposed and also helps improve the throughput and increase the manufacturing speed.

20 Claims, 13 Drawing Sheets

DRUM-TYPE IC BURN-IN AND TEST EQUIPMENT

TECHNICAL FIELD OF THE INVENTION

The present invention generally relates to drum-type IC (Integrated Circuit) burn-in and test equipment, and more particularly to an arrangement that comprises a drum-type burn-in device comprises a plurality of planar sections circumferentially mounted thereto and each planar section comprise at least one burner mounted thereto so that with the drum-type burn-in device being rotatably mounted between a first working platform and a second working platform, a parts feeding device is operable to sequentially dispose unburned ICs and a parts transferring device is operable to sequentially pick up completely-burned ICs so that the drum-type burn-in device helps increase the number of ICs disposed so as to improve the throughput and to increase the manufacturing speed.

DESCRIPTION OF THE PRIOR ART

To pick up and place an integrated circuit (IC), a robotic arm of conventional burn-in equipment is structured such that a linearly movable X-shaft carries and moves a linearly movable Y-shaft to carry out positioning in a horizontal coordinate system and afterwards, a linearly movable Z-shaft carried by the Y-shaft carries performs a vertical movement to pick up or place the IC. This process is sequentially and cyclically performed. However, the three shafts are arranged together in such a way that they cannot carry out parallel operations and this affects the manufacture greatly. Further, the conventional burn-in equipment is provided with image recognition assemblies to detect positional shift of an IC before it is disposed in a burn-in device of the conventional burn-in equipment. This increases the complexity of the Z-shaft mechanism and also indirectly increases the torque loading of the X and Y motion shaft, eventually leading to a drawback of increasing manufacturing cost. Thus, there is still room for improvement of operation flows of feeding, burning, and conveying among components of the conventional burn-in equipment.

Conventional IC burn-in equipment generally comprises a parts feeding section, wherein the parts feeding section comprises a parts feeding suction nozzle for picking up an unburned IC through a suction force and the parts feeding section is driven by a servo motor so as to have the parts feeding section horizontally movable for conveying an IC to a parts disposition section; a parts disposition section, wherein the parts disposition section comprises a parts disposition seat and the parts disposition seat functions to receive ICs to be burned to dispose therein; a plurality of burners, wherein the burners are operable to retain ICs thereon; a displacement arm, wherein the displacement arm is driven by the servo motor and the displacement arm comprises a first parts transferring suction nozzle, whereby when the parts disposition seat has ICs disposed therein, the first parts transferring suction nozzle of the displacement arm is rotated toward the parts disposition seat for being ready to pick up the unburned ICs through suction force and when the first parts transferring suction nozzle picks up, through suction forces, the unburned ICs of the parts disposition seat for being sequentially moved to the burners to be disposed thereon and waits for the burning operation to be completed, the first parts transferring suction nozzle picks up the completely-burned IC through suction forces to be sequentially moved to and disposed in the parts disposition seat so as to repeatedly and successively the burning and dispensing operations to achieve the effect of burning ICs.

The conventional IC burn-in equipment, although effective in burning ICs, must have each burner waiting for the displacement arm to dispose an IC thereon before a burning operation can be carried out because the displacement arm is just a single arm and is rotatable only on a plane. This leads to a drawback of greatly extending the time period of burning operation. Further, the number of the burners that can be reachable by the displacement arm is susceptible to space limitation, making it is not possible to increase the number of burners installed, whereby the available number of ICs that can be disposed in the conventional IC burn-in equipment may be insufficient, making it no possible to increase the throughput of IC and thus the manufacturing speed is reduced.

Thus, the present invention aims to overcome the technical difficulty of the above-discussed issues.

SUMMARY OF THE INVENTION

In view of the drawbacks of the conventional IC burn-in equipment that the number of the burners cannot be increased and the manufacturing speed is low, an object of the present invention is to provides drum-type IC burn-in and test equipment, wherein a drum-type burn-in device comprises a plurality of planar sections circumferentially mounted thereto and each of the planar sections comprises at least one burner mounted thereon and wherein the drum-type burn-in device is rotatably mounted between a first working platform and a second working platform to allow a parts feeding device to sequentially dispose unburned ICs thereon, whereby completely-burned Ics can be sequentially picked up by a parts transferring device so that, with the drum-type burn-in device, an effect of increasing the number of ICs disposed can be achieved so as to improve the throughput and to increase the manufacturing speed.

To achieve the above object, the present invention provides drum-type IC burn-in and test equipment, which comprises:

burn-in equipment, wherein the burn-in equipment comprises therein a first working platform, a second working platform, a drum-type burn-in device, and a parts pickup device. The first working platform comprises a first parts disposition section. The first working platform comprises a parts feeding device. The parts feeding device comprises a horizontal displacement device and the displacement device comprises a vertical displacement device. The vertical displacement device comprises a first parts pickup suction nozzle. The second working platform comprises a second parts disposition section. The second working platform comprises a parts transferring device. The parts transferring device comprises a horizontal displacement device and the displacement device comprises a vertical displacement device. The vertical displacement device comprises a second parts pickup suction nozzle. The drum-type burn-in device comprises a rotation axle and the drum-type burn-in device is rotatably mounted between the first working platform and the second working platform. The drum-type burn-in device comprises a plurality of planar sections circumferentially mounted thereto and each of the planar sections comprises at least one burner mounted thereto. The parts pickup device is arranged above the drum-type burn-in device.

The drum-type IC burn-in and test equipment provided by the present invention provides a drum-type burn-in device that comprises a plurality of planar sections circumferentially mounted thereto and each of the planar sections comprises at least one burner mounted thereto. The drum-type burn-in device is rotatably mounted between a first working platform and a second working platform to allow a parts feeding device to sequentially dispose unburned Ics thereon. A parts transferring device may later be used to sequentially pick up completely-burned ICs. Thus, with the drum-type burn-in device, the number of ICs can be can be disposed is increased so that the throughput can be increased and the manufactured speed enhanced.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
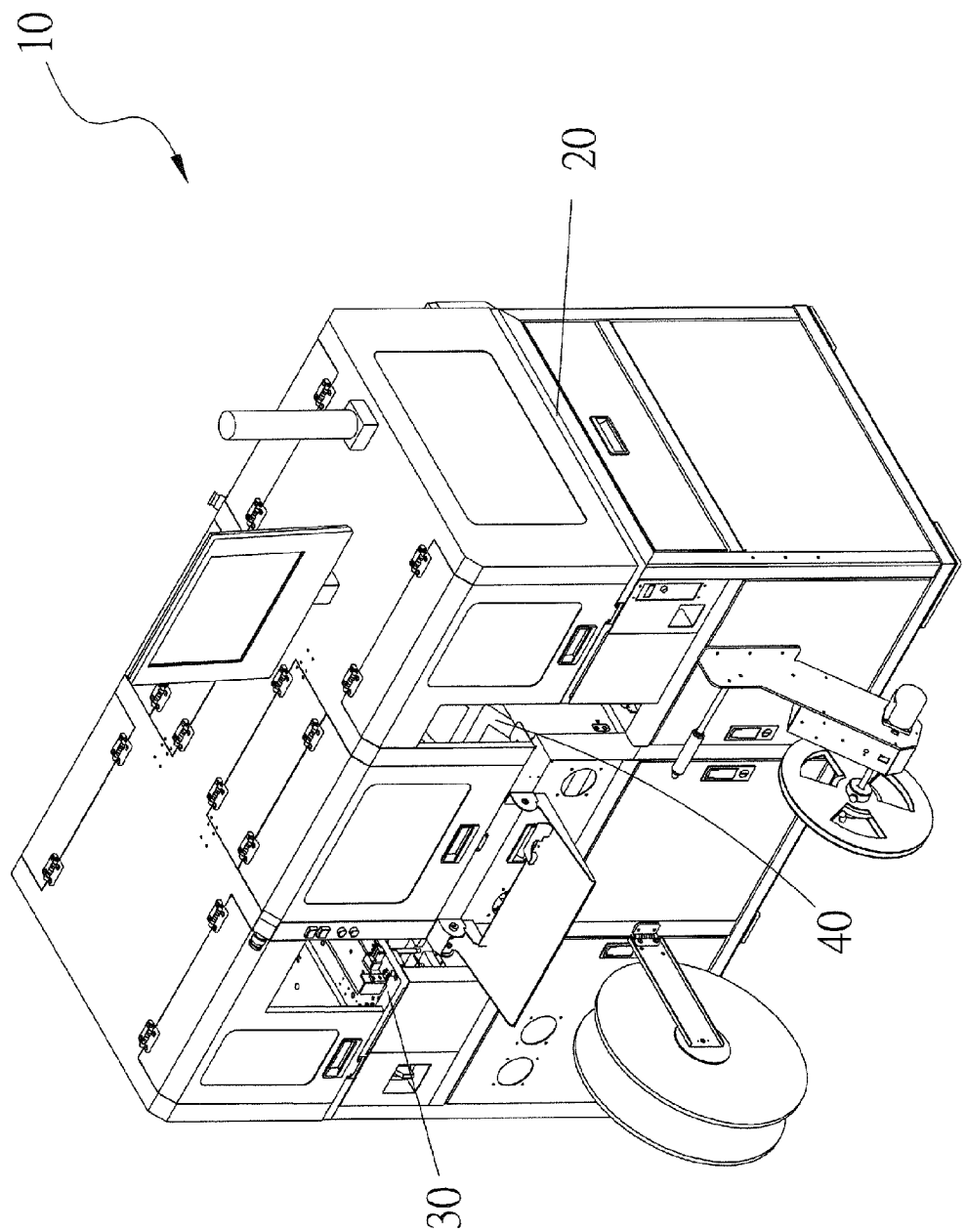
FIG. 1 is a perspective view of the present invention.
Figure 2:
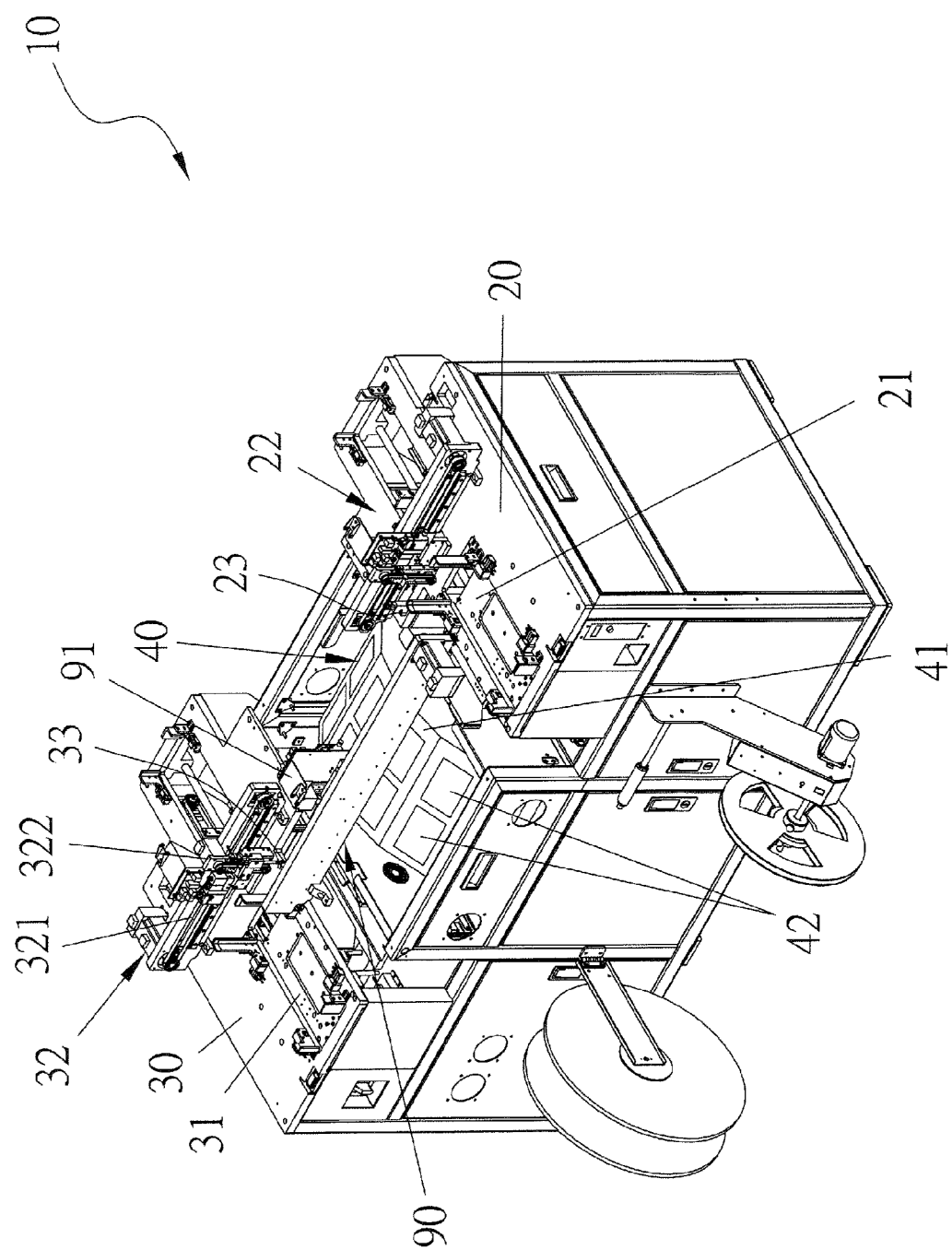
FIG. 2 is a perspective view showing inside details of the present invention.

Referring to FIGS. 1 and 2, the present invention provides a drum-type IC (Integrated Circuit) burn-in and test equipment, which comprises burn-in equipment 10.

Figure 3:
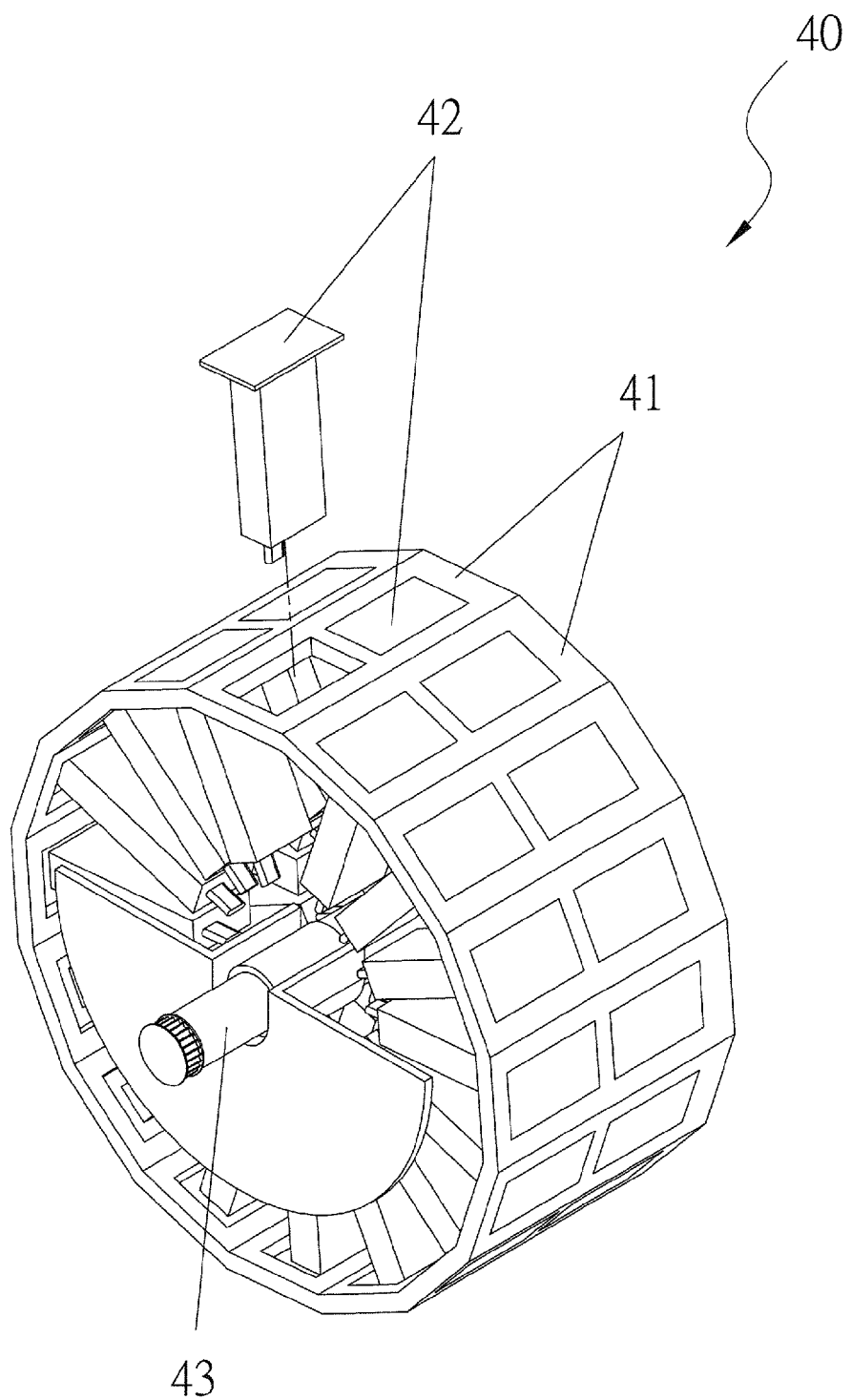
FIG. 3 is a perspective view of a drum-type burn-in device of the present invention.
Figure 4:
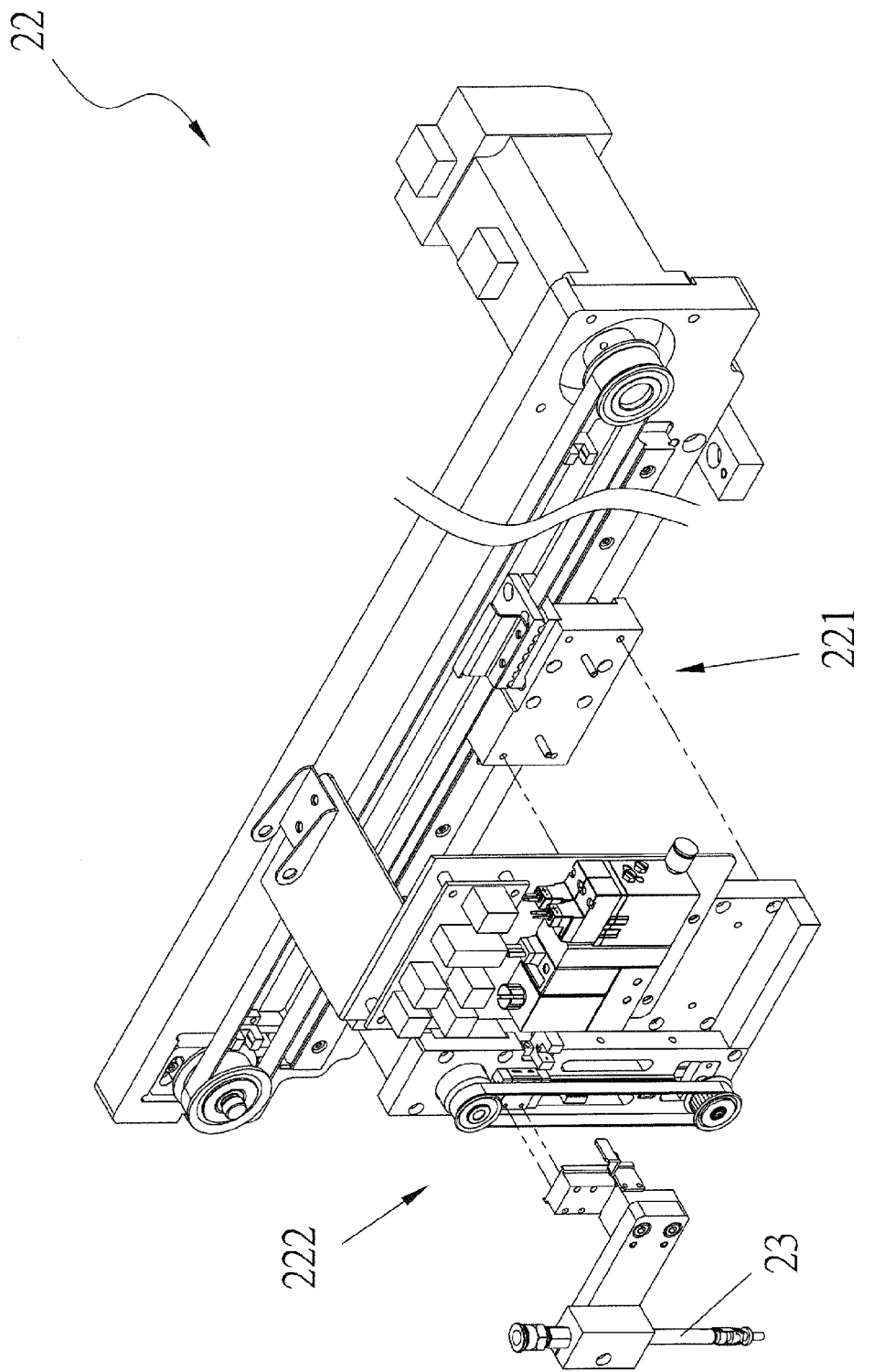
FIG. 4 is an exploded view showing a parts feeding device of the present invention.
Figure 5:
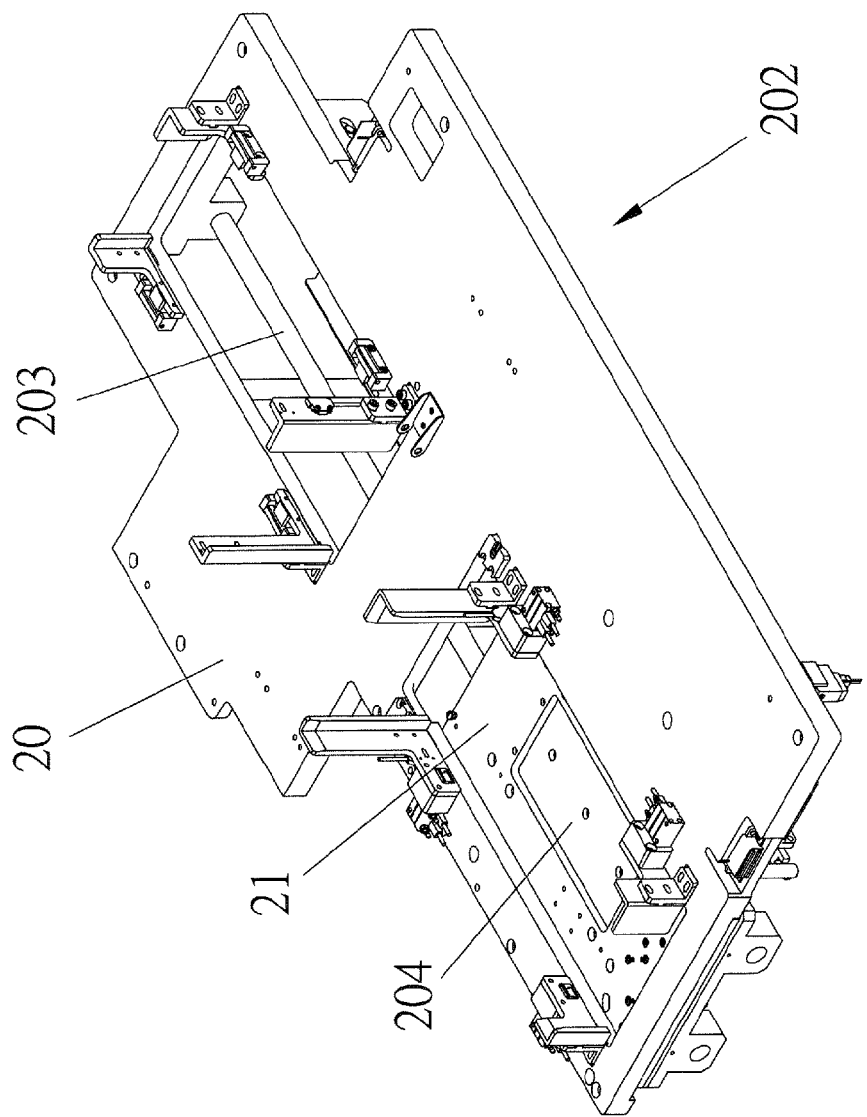
FIG. 5 is a perspective view showing a parts disposition seat displacement device of the present invention.

The burn-in equipment 10 comprises a first working platform 20, a second working platform 30, a drum-type burn-in device 40, and a parts pickup device 90. The first working platform 20 comprises, mounted therein, a parts disposition seat displacement device 202 and the first working platform 20 is provided with a first parts disposition section 21, and the first parts disposition section 21 is arranged on the parts disposition seat displacement device 202, as shown in FIG. 5. The first working platform 20 is provided with a parts feeding device 22 and the parts feeding device 22 comprises a horizontal displacement device 221 and the displacement device comprises a vertical displacement device 222 and the vertical displacement device 222 comprises a first parts pickup suction nozzle 23, as shown in FIG. 4. The second working platform 30 also comprises, mounted therein, a parts disposition seat displacement device 202 and the second working platform 30 is provided with a second parts disposition section 31, and the second parts disposition section 31 is arranged on the parts disposition seat displacement device 202 of the second working platform 30. The second working platform 30 comprises a parts transferring device 32 and the parts transferring device 32 comprises a horizontal displacement device 321 and the displacement device comprises a vertical displacement device 322. The vertical displacement device 322 comprises a second parts pickup suction nozzle 33. The burn-in equipment 10 comprises the drum-type burn-in device 40 mounted therein and the drum-type burn-in device 40 comprises a rotation axle 43. The rotation axle 43 of the drum-type burn-in device 40 is rotatably mounted between the first working platform 20 and the second working platform 30. The drum-type burn-in device 40 comprises a plurality of planar sections circumferentially mounted thereto and each of the planar sections receives at least one burner 42 mounted thereto, as shown in FIG. 3. The parts pickup device 90 is arranged above the drum-type burn-in device 40 and the parts pickup device 90 comprises a horizontal displacement device 91 and the horizontal displacement device 91 comprises a parts pickup suction nozzle 911.

Figure 6:
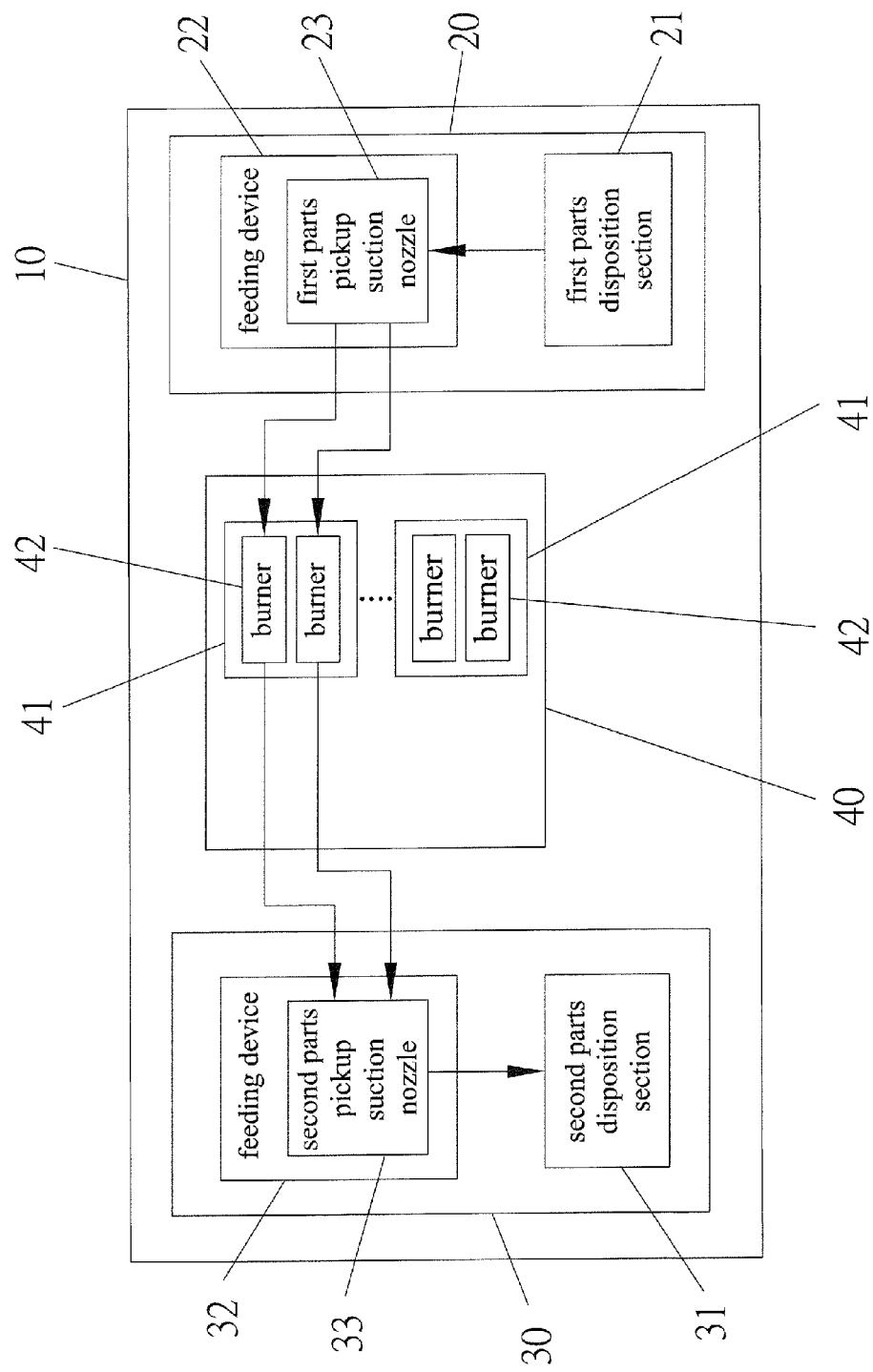
FIG. 6 is a block diagram illustrating an operation of the present invention.
Figure 7:
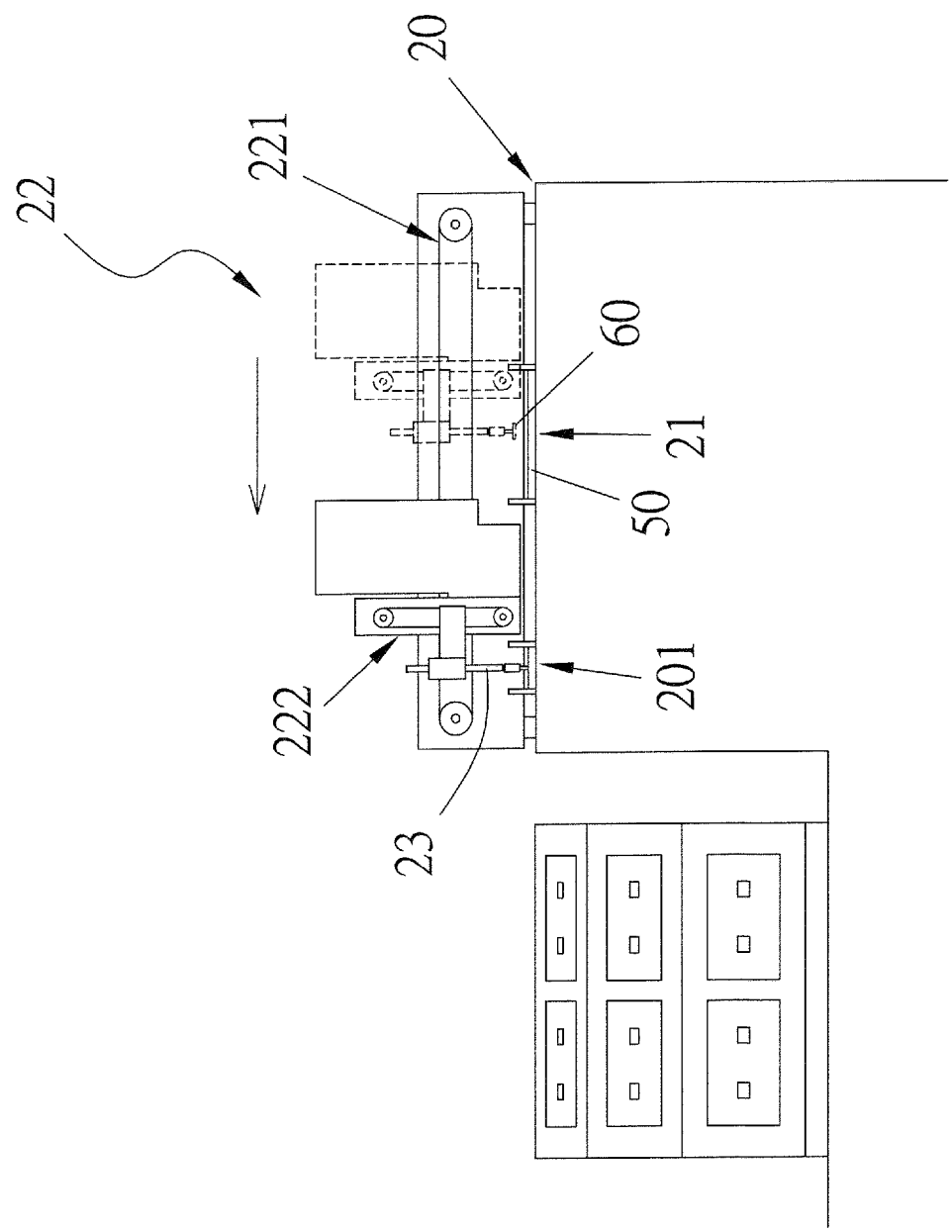
FIG. 7 is a schematic view showing an operation condition of a parts feeding device.
Figure 8:
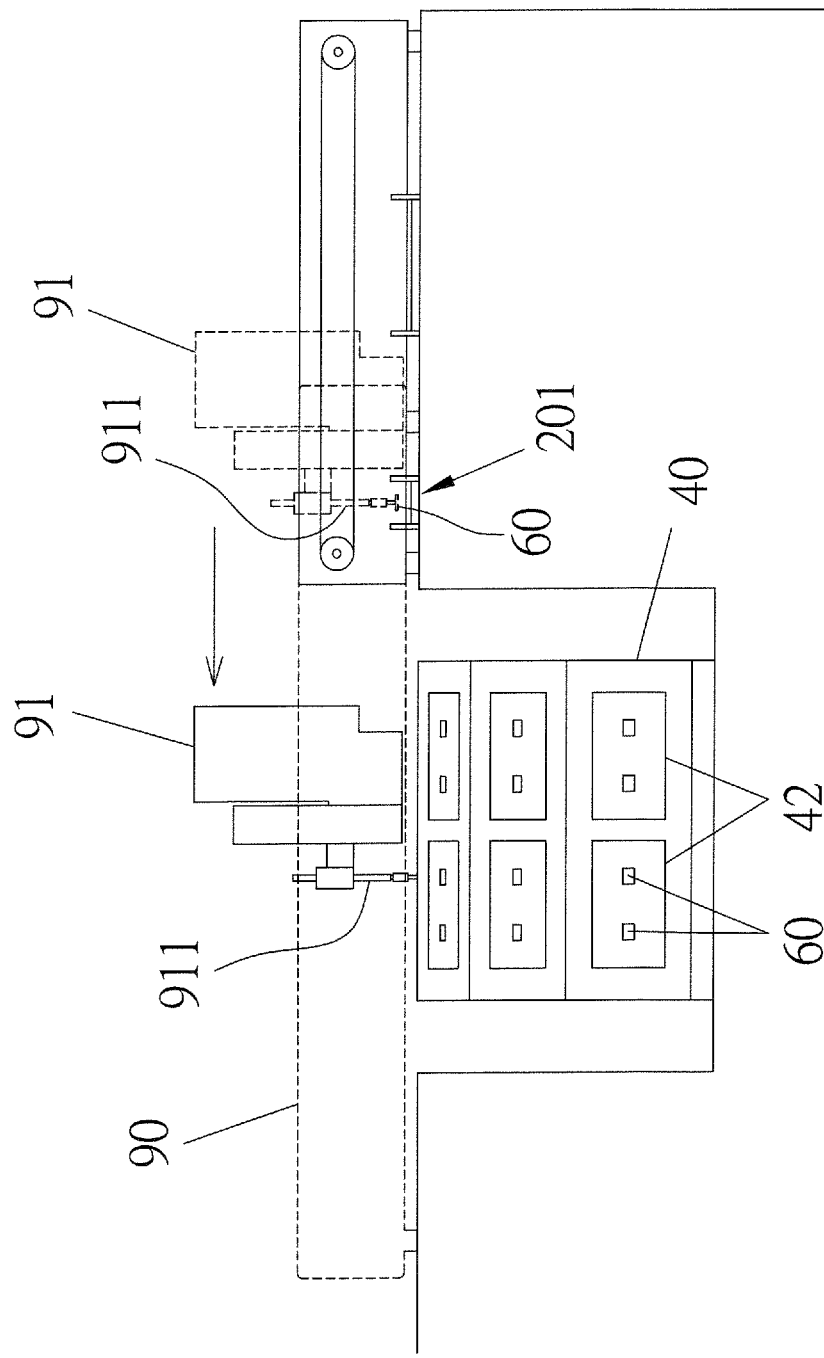
FIG. 8 is a schematic view illustrating an operation of a parts pickup suction nozzle of a horizontally displacement device of the present invention.
Figure 9:
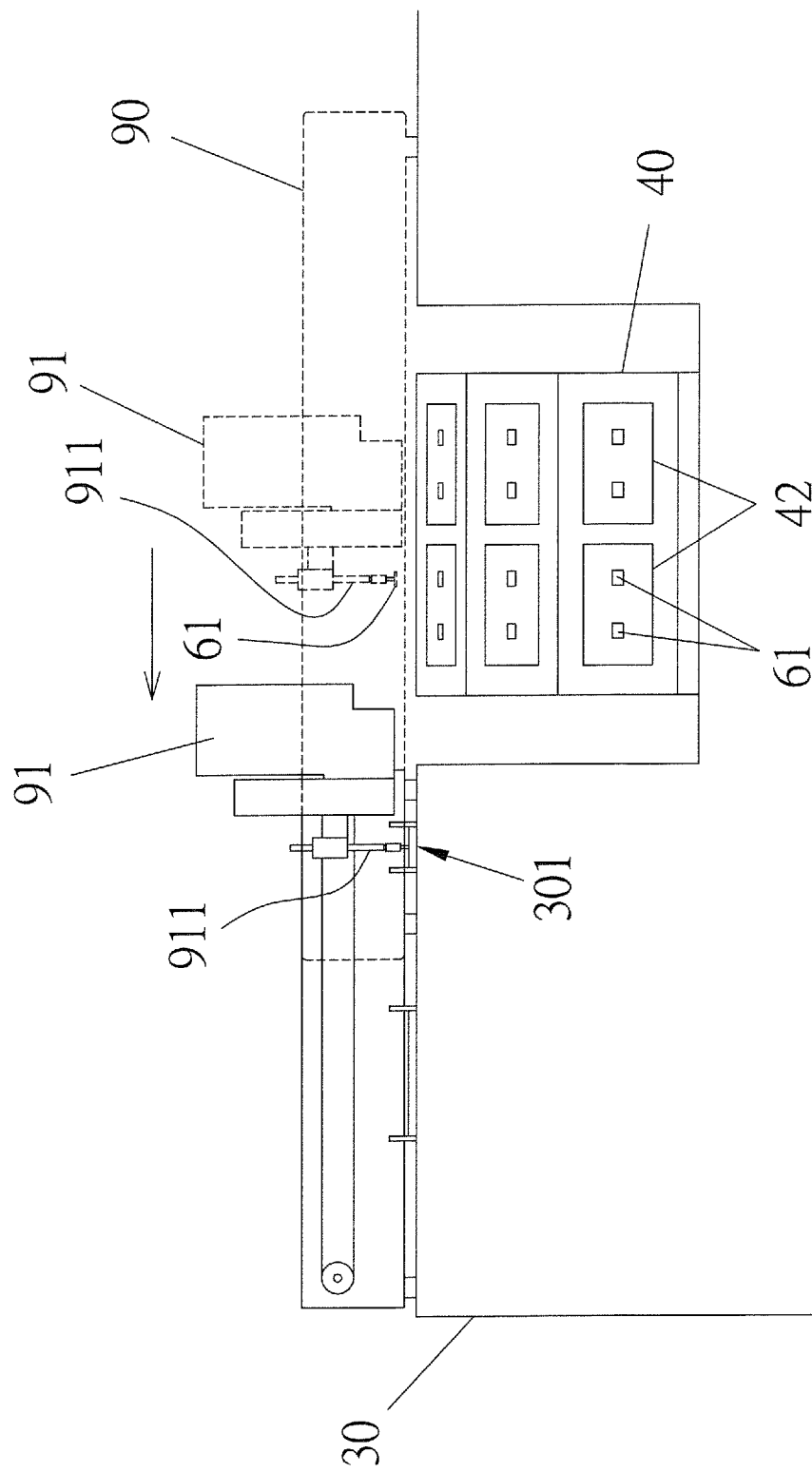
FIG. 9 is a schematic view illustrating an operation of a parts pickup suction nozzle of a horizontally displacement device of the present invention.
Figure 10:
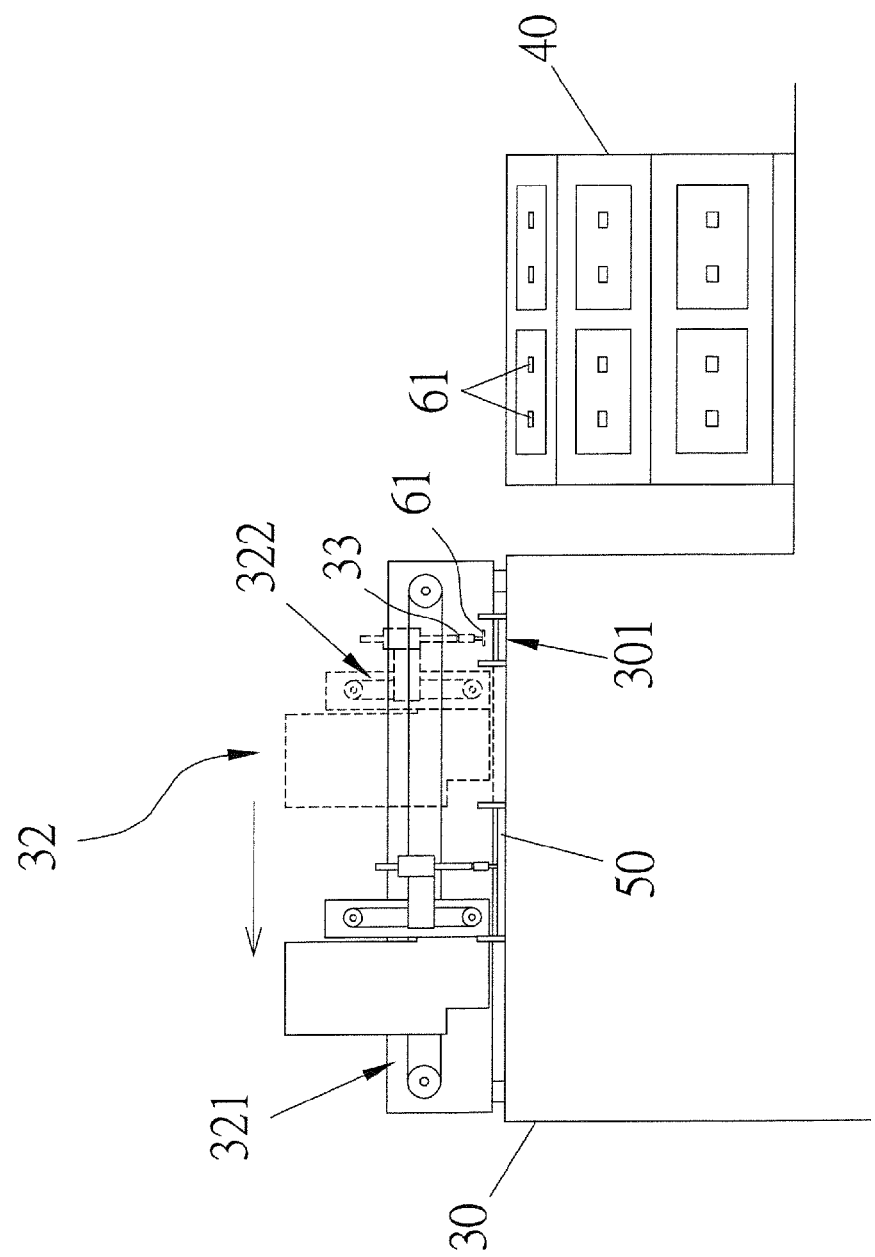
FIG. 10 is a schematic view showing an operation condition of a parts transferring device.

Referring to FIG. 6, in an attempt to use the present invention to burn an IC, with additional reference to FIGS. 7 and 8, the present invention makes use of the arrangement that the parts feeding device 22 is provide with the first parts pickup suction nozzle 23 in such a way that the first parts pickup suction nozzle 23 uses vacuum suction force to pick and remove an unburned IC 60 from the external parts disposition seat 50 that is disposed on the first parts disposition section 21; and with the arrangement that the first working platform 20 is provided with the parts feeding device 22 that is provided with the horizontal displacement device 221 and the horizontal displacement device 221 is provided with the vertical displacement device 222, the first parts pickup suction nozzle 23 is movable up and down to pick up or place an IC so that an the unburned IC 60 can be moved to the temporary parts disposition seat 201 of the first platform 20 to allow the parts pickup suction nozzle 911 of the horizontal displacement device 91 of the parts pickup device 90 to move and place the unburned IC 60 on the burners 42 of the drum-type burn-in device 40 in order to achieve disposing and positioning of the unburned IC 60;

further with the arrangement that the drum-type burn-in device 40 is automatically rotatable and positionable, unburned ICs 60 are allowed to be respectively set on the burners 42 of the platform sections 41 of the drum-type burn-in device 40 to achieve an effect of three-dimensionally circumferential arrangement for burning ICs and thus the number of ICs that can be disposed thereon is increased. Further, an improvement made over the conventional way of planar movement is that the present invention allows the drum-type burn-in device 40 to be folded to show a cylindrical form, allowing for an effect of operation in a rolling motion, whereby arms of the parts feeding device 22 and the parts transferring device 32 that are operated with translation movement are allowed to operate in a parallel manner to greatly reduce the time required for parts pickup and parts disposition. Further, as shown in FIGS. 9 and 10, when an unburned IC 60 completely goes through a burning process by the burner 42 to become a completely-burned IC 61, the parts pickup suction nozzle 911 of the horizontal displacement device 91 of the parts pickup device 90 picks up the completely-burned IC 61 from the burner 42 of the drum-type burn-in device 40 through vacuum suction force and then the horizontal displacement device 91 horizontally moves to the site corresponding to the temporary parts disposition seat 301 of the second platform 30 to be disposed thereon. With the second working platform 30 of the present invention being provided with the parts transferring device 32 and the parts transferring device 32 being provided the second parts pickup suction nozzle 33, the second parts pickup suction nozzle 33 may be moved by the horizontal displacement device 321 and the vertical displacement device 322 of the parts transferring device 32 to achieve the effect of moving the second parts pickup suction nozzle 33 up and down so that the completely-burned IC 61 disposed on the temporary parts disposition seat 301 of the second platform 30 can be picked up by the second parts pickup suction nozzle 33 through vacuum suction force to have the completely-burned IC 61 moved from the drum-type burn-in device 40 to the external parts disposition seat 50 disposed on the second parts disposition section 31. The burning and dispensing operations are repeatedly and successively performed so that the present invention allows for simulation operations of multiple axes and, through the drum-type burn-in device 40, achieves an effect of circular motion thereby shortening the time of movement of the arms of the parts feeding device 22 and the parts transferring device 32 so as to provide advantages of increasing production speed and quantity and improving efficiency. The present invention also achieve an effect of converting two-dimensional planar operation zone into three-dimensional operation space to provide an advantage of reducing operation area so as to allow for an increased number of machines to be installed and enhancing space efficiency.

Figure 11:
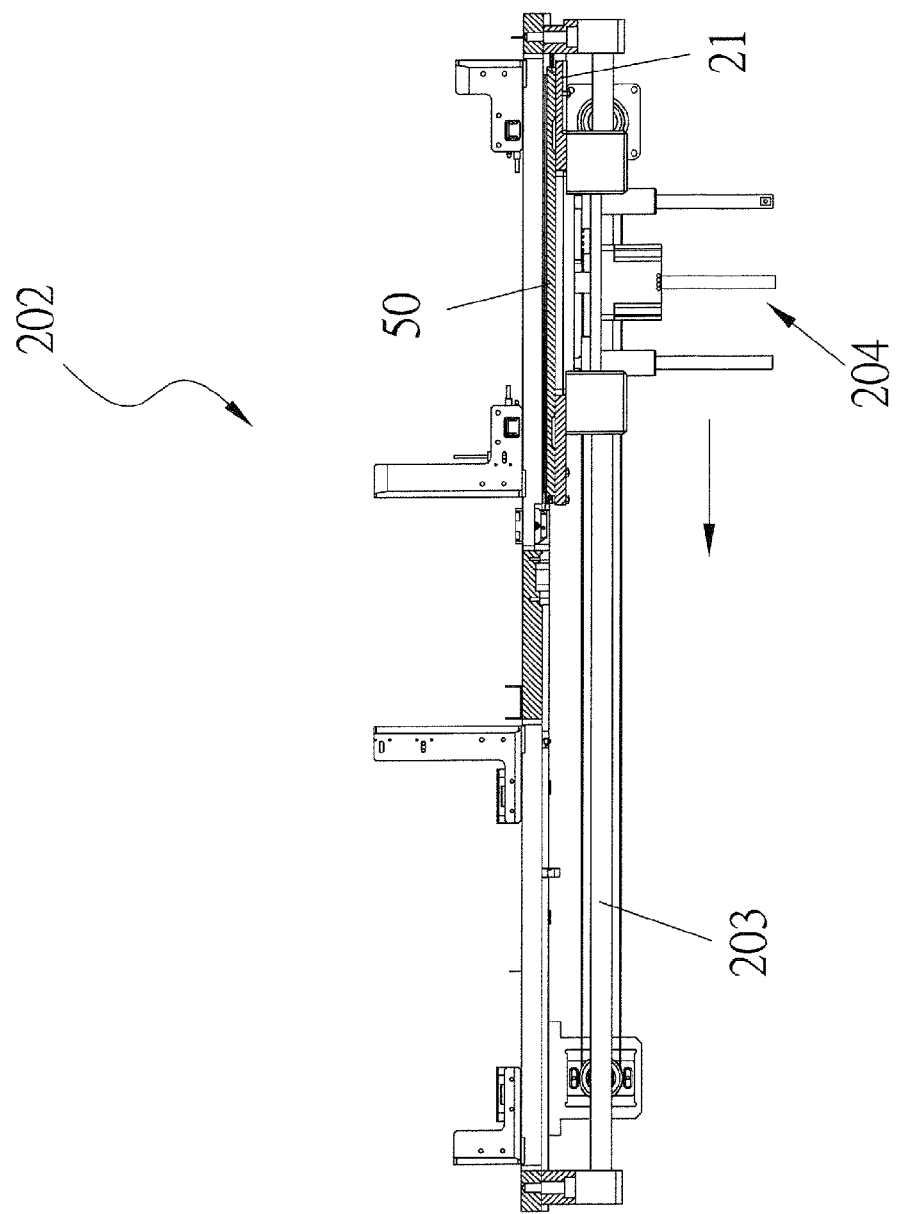
FIG. 11 is a schematic view illustrating a condition before an operation of a parts disposition displacement device is performed.
Figure 12:
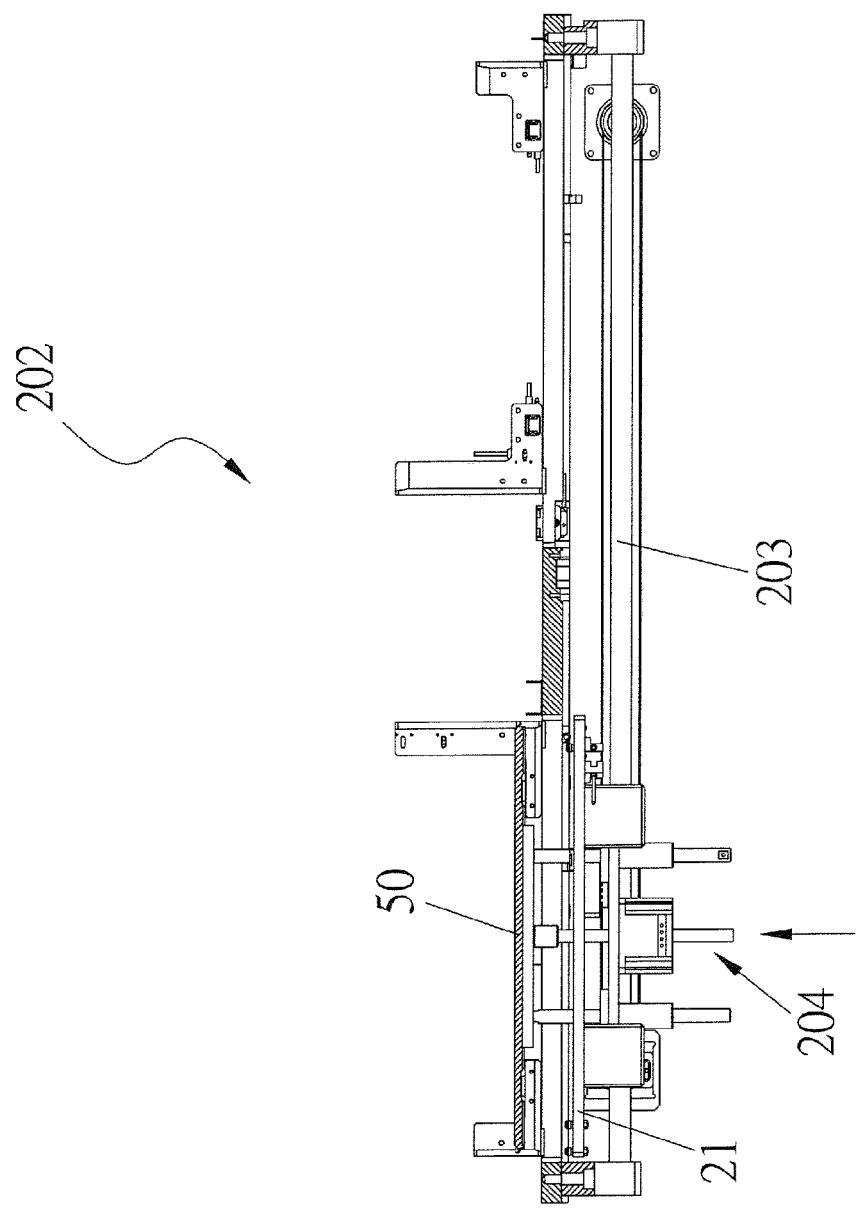
FIG. 12 is a schematic view illustrating a condition after an operation of a parts disposition displacement device is performed.

Referring to FIGS. 11 and 12, with the arrangements that the first parts disposition section 21 of the parts disposition seat displacement device 202 of the present invention receiving the parts disposition seat 50 to dispose thereon, the parts disposition seat displacement device 202 having a lower end to which the horizontal displacement device 203 is mounted, the horizontal displacement device 203 comprising the lifting device 204, the parts disposition seat 50 being arranged on the lifting device 204, when the unburned ICs 60 disposed in the parts disposition seat 50 have been completely picked and removed, the horizontal displacement device 203 moves the parts disposition seat 50 to have the parts disposition seat 50 moved to another place, and under this condition, with the arrangements that the horizontal displacement device 203 comprises the lifting device 204, an effect of moving the parts disposition seat 50 up can be achieved to allow an operator to pick up the empty the parts disposition seat 50 so as to achieve automatic operation.

Figure 13:
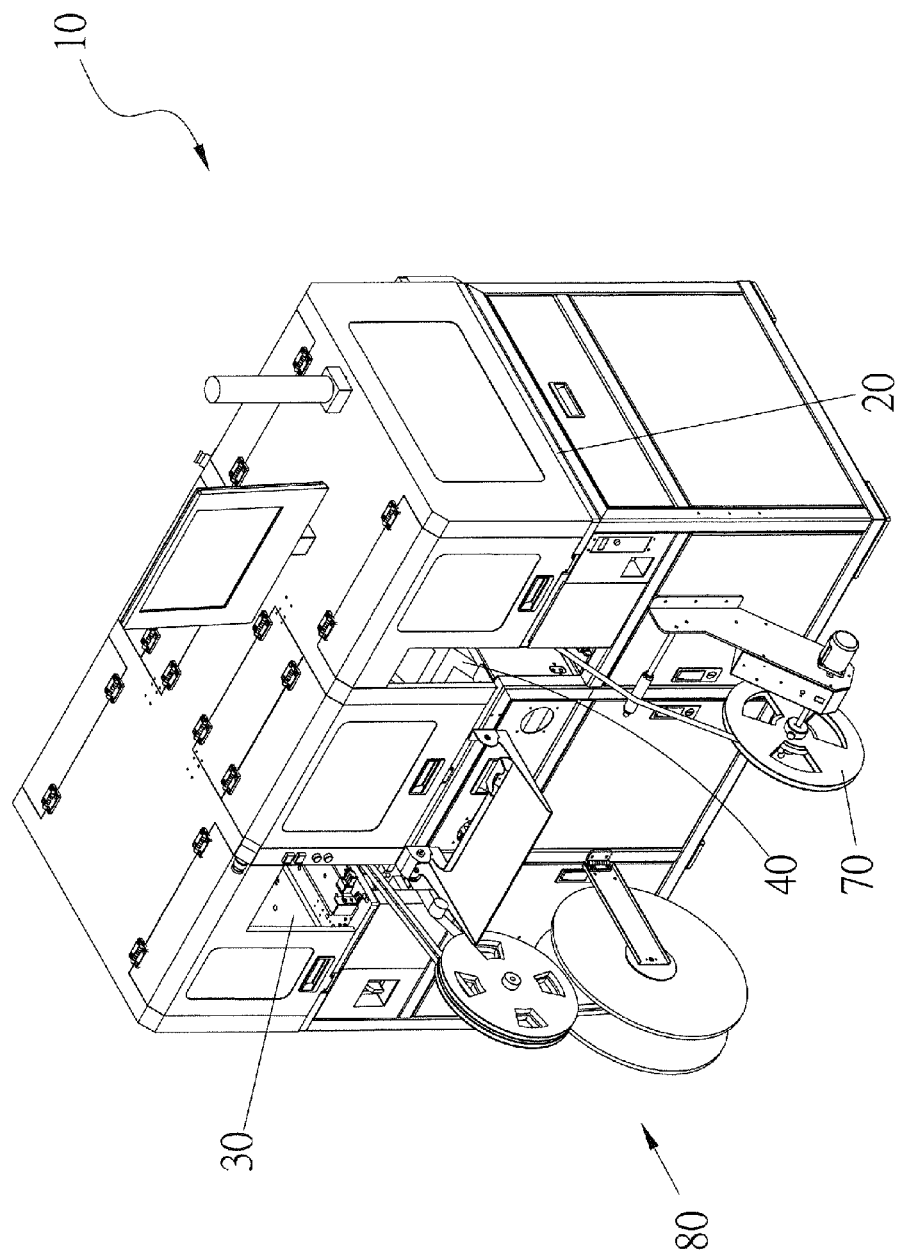
FIG. 13 is a perspective view showing a second embodiment of the present invention.

Referring to FIG. 13, a second embodiment of the present invention is shown, wherein the burn-in equipment 10 according to the present invention further comprises a parts feeding conveyor 70 and a parts transferring conveyor 80. The parts feeding conveyor 70 is provided to allow the first parts pickup suction nozzle 23 of the parts feeding device 22 to pick up unburned IC 60 through vacuum suction forces. The parts transferring conveyor 80 is provided to allow the second parts pickup suction nozzle 33 of the parts transferring device 32 to pick up completely-burned ICs 61 through vacuum suction forces. When a user attempts to burn ICs with the present invention, the first parts pickup suction nozzle 23 is operated to apply vacuum suction forces to pick up the unburned ICs 60 from the parts feeding conveyor 70 and then moves the unburned IC 60 to the temporary parts disposition seat 201 to allow the parts pickup suction nozzle 911 of the horizontal displacement device 91 of the parts pickup device 90 to place the unburned ICs 60 on the burners 42 of the drum-type burn-in device 40 to achieve disposing and positioning of the unburned ICs 60. When the unburned ICs 60 pass through the burning operation carried out by the burners 42 to become completely-burned ICs 61, the parts pickup suction nozzle 911 of the horizontal displacement device 91 of the parts pickup device 90 picks up the completely-burned ICs 61 from the burners 42 of the drum-type burn-in device 40 through vacuum suction forces for being horizontally moved by the horizontal displacement device 91 to be disposed in the temporary parts disposition seat 301 of the second platform 30, where the second parts pickup suction nozzle 33 of the parts transferring device 32 applies vacuum suction forces to pick up the completely-burned ICs 61 disposed in the temporary parts disposition seat 301 of the second platform and moves the completely-burned. IC 61 to the parts transferring conveyor 80. The burning and dispensing operations are repeatedly and successively carried out so that the completely-burned ICs 61 can be collected by the parts transferring conveyor 80 to thereby increase the manufacturing speed and number.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A drum-type IC (Integrated Circuit) burn-in and test equipment, comprising:
   a parts feeding device comprising a first horizontal displacement device and a first vertical displacement device, wherein the first vertical displacement device comprises a first parts pickup suction nozzle configured to pick up a part from a first parts disposition seat to a second parts disposition seat in a path where the part is moved in a horizontal direction by the first horizontal displacement device;

a parts transferring device comprising a second horizontal displacement device and a second vertical displacement device, wherein the second vertical displacement device comprises a second parts pickup suction nozzle configured to pick up the part from a third parts disposition seat to a fourth parts disposition seat in a path where the part is moved in the horizontal direction by the second horizontal displacement device;

a drum-type burn-in device comprising a rotation axle, wherein the drum-type burn-in device configured to rotate with respect to the rotation axle parallel to the horizontal direction, wherein the drum-type burn-in device comprises multiple planar sections circumferentially mounted thereto and configured to rotate with respect to the rotation axle, wherein the drum-type burn-in device comprises a burner mounted to one of the planar sections; and a parts pickup device arranged above the drum-type burn-in device, wherein the parts pickup device comprises a third horizontal displacement device, wherein the third horizontal displacement device comprises a third parts pickup suction nozzle configured to pick up the part from the second parts disposition seat to one of the planar sections in a path where the part is moved in the horizontal direction by the third horizontal displacement device, wherein the third parts pickup suction nozzle is configured to pick up the part from said one of the planar sections to the third parts disposition seat in a path where the part is moved in the horizontal direction by the third horizontal displacement.

2. The drum-type burn-in and test equipment according to claim 1, wherein the first parts pickup suction nozzle is operable to generate vacuum suction forces to pick up the part.

3. The drum-type burn-in and test equipment according to claim 1, wherein the second parts pickup suction nozzle is operable to generate vacuum suction forces to pick up the part.

4. The drum-type burn-in and test equipment according to claim 1, wherein the third parts pickup suction nozzle is operable to generate vacuum suction forces to pick up the part.

5. The drum-type burn-in and test equipment according to claim 1, wherein the part comprises an integrated circuit.

6. The drum-type burn-in and test equipment according to claim 1, wherein the first parts disposition seat is configured to horizontally move.

7. The drum-type burn-in and test equipment according to claim 1, wherein the first parts disposition seat is configured to vertically move.

8. The drum-type burn-in and test equipment according to claim 1, wherein the first parts disposition seat is provided by a parts feeding conveyor.

9. The drum-type burn-in and test equipment according to claim 1, wherein the fourth parts disposition seat is provided by a parts transferring conveyor.

10. A drum-type burn-in and test equipment, comprising:
a parts feeding device comprising a first parts pickup suction nozzle configured to pick up a part from a first parts disposition seat to a second parts disposition seat in a path where the part is moved in a direction;

a parts transferring device comprising a second parts pickup suction nozzle configured to pick up the part from a third parts disposition seat to a fourth parts disposition seat in a path where the part is moved in the direction;

a drum-type burn-in device configured to rotate with respect to a rotation axle of the drum-type burn-in device parallel to the direction, wherein the drum-type burn-in device comprises multiple planar sections circumferentially mounted thereto and configured to rotate with respect to the rotation axle, wherein the drum-type burn-in device comprises a burner mounted to one of the planar sections; and a parts pickup device over the drum-type burn-in device, wherein the parts pickup device comprises a third parts pickup suction nozzle configured to pick up the part from the second parts disposition seat to one of the planar sections in a path where the part is moved in the direction and to pick up the part from said one of the planar sections to the third parts disposition seat in a path where the part is moved in the direction.

11. The drum-type burn-in and test equipment of claim 10, wherein the first parts pickup suction nozzle is operable to generate vacuum suction forces to pick up the part.

12. The drum-type burn-in and test equipment of claim 10, wherein the second parts pickup suction nozzle is operable to generate vacuum suction forces to pick up the part.

13. The drum-type burn-in and test equipment of claim 10, wherein the third parts pickup suction nozzle is operable to generate vacuum suction forces to pick up the part.

14. The drum-type burn-in and test equipment of claim 10, wherein the part comprises an integrated circuit.

15. The drum-type burn-in and test equipment of claim 10, wherein the first parts disposition seat is provided by a parts feeding conveyor.

16. The drum-type burn-in and test equipment of claim 10, wherein the fourth parts disposition seat is provided by a parts transferring conveyor.

17. A drum-type test equipment, comprising:
a drum-type testing device configured to rotate with respect to a rotation axle of the drum-type testing device, wherein the drum-type testing device comprises multiple planar sections circumferentially mounted thereto and configured to rotate with respect to the rotation axle; and a parts pickup device over the drum-type testing device, wherein the parts pickup device comprises a parts pickup suction nozzle configured to pick up a part from a first parts disposition seat to one of the planar sections and to pick up the part from said one of the planar sections to a second parts disposition seat.

18. The drum-type test equipment of claim 17, wherein the parts pickup suction nozzle is operable to generate vacuum suction forces to pick up the part.

19. The drum-type test equipment of claim 17, wherein the part comprises an integrated circuit.

20. The drum-type test equipment of claim 17 further comprising a burner mounted to one of the planar sections.

* * * * *